United States Patent
Wolff et al.

(10) Patent No.: US 7,861,216 B2
(45) Date of Patent: Dec. 28, 2010

(54) PORTABLE EQUIPMENT AND VIRTUAL REALITY METHOD FOR OPTIMISATION OF A VISUAL INSPECTION AND EXPERT APPRAISAL OF A STRUCTURE PARTICULARLY IN CIVIL ENGINEERING

(75) Inventors: Valentin Wolff, Avon (FR); Bruno Gerard, Montigny sur Loing (FR); Olivier Bernard, Fontainebleau (FR)

(73) Assignee: Oxand, Avon (FR)

( * ) Notice: Subject to any disclaimer, the term of this patent is extended or adjusted under 35 U.S.C. 154(b) by 1507 days.

(21) Appl. No.: 10/548,451

(22) PCT Filed: Mar. 11, 2004

(86) PCT No.: PCT/FR2004/000595

§ 371 (c)(1),
(2), (4) Date: Sep. 12, 2005

(87) PCT Pub. No.: WO2004/084118

PCT Pub. Date: Sep. 30, 2004

(65) Prior Publication Data

US 2006/0095214 A1    May 4, 2006

(30) Foreign Application Priority Data

Mar. 11, 2003   (FR) .................................. 03 02971

(51) Int. Cl.
*G06F 9/44*   (2006.01)
(52) U.S. Cl. .................. 717/105; 717/109; 717/113; 717/116

(58) Field of Classification Search ................ None
See application file for complete search history.

(56) References Cited

U.S. PATENT DOCUMENTS

| 4,404,682 A | 9/1983 | Hayashi et al. |
| 5,305,645 A | 4/1994 | Reifsnider et al. |
| 5,455,777 A | 10/1995 | Fujiyama et al. |
| 2005/0171746 A1 * | 8/2005 | Thalhammer-Reyero ....... 703/2 |

FOREIGN PATENT DOCUMENTS

| DE | 41 39 107 | 7/1993 |
| EP | 0 287 501 A2 | 10/1988 |
| EP | 505 045 A2 | 9/1992 |
| EP | 0 517 238 A1 | 12/1992 |
| JP | 6180281 | 6/1994 |

\* cited by examiner

*Primary Examiner*—Chuck O Kendall
(74) *Attorney, Agent, or Firm*—Young & Thompson

(57) ABSTRACT

Portable equipment for optimization of a visual inspection and expert appraisal of a structure, particularly in civil engineering, includes an on-board database of visual references for decay in different states of advancement and computing elements for calculation, by interpolation of data from a database of results from predictive physical simulations of materials and structures, of indicators of deterioration and key aging parameters to represent several possible visual appearances of an element of the structure in different stages of the life thereof from reference images from the database of visual references and categorization of the state of the structure by comparison with the actual appearance.

11 Claims, 5 Drawing Sheets

Figure 1:
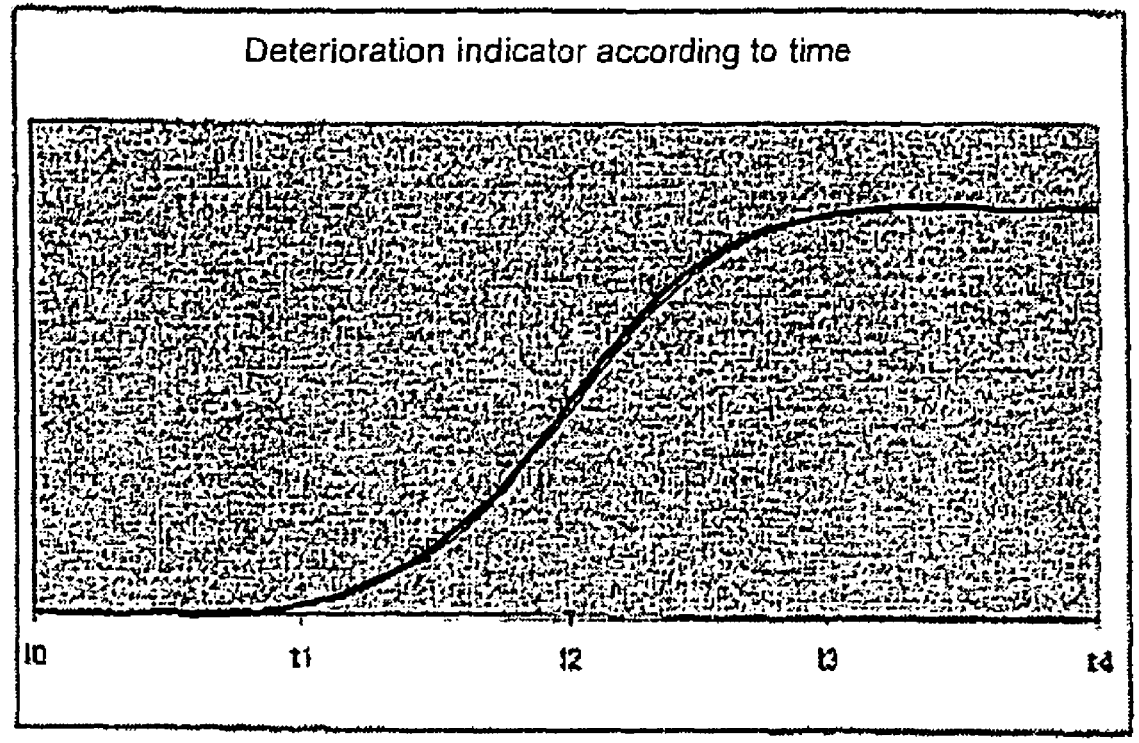

PORTABLE EQUIPMENT AND VIRTUAL REALITY METHOD FOR OPTIMISATION OF A VISUAL INSPECTION AND EXPERT APPRAISAL OF A STRUCTURE PARTICULARLY IN CIVIL ENGINEERING

The present invention relates to a portable equipment to optimize a visual inspection and a survey of a structure, in particular in civil engineering. It also proposes a virtual reality method implemented in this equipment.

There are already calculation codes allowing structural deterioration to be simulated. However, these calculation codes are intended to be used by experts or engineers, and require great computing power. They are not therefore easily usable on site. This is the case in particular for difficult access structures which are inspected by mountaineers or divers.

Also, visual inspection software exists, operating on a palmtop computer which then allows a database to be fed. However, these software packages are simply tools for inputting information.

The aim of the present invention is to propose a portable equipment allowing visual inspection to be improved by knowledge of ageing models.

This object is achieved with portable equipment to optimize a visual inspection and survey of a structure, in particular in civil engineering, comprising:

a mobile visual references database to pathologies at different stages of progress, and software means for:

calculating, by interpolation of data coming from a predictive material and structural physical simulation results database, deterioration indicators and key ageing parameters, representing several possible visual aspects of a structural element of said structure at different moments of its life, using reference images coming from the visual references database, and categorizing the state of said structure by comparing the actual aspect of said structure with said reference images.

The equipment according to the invention thus allows for the comparison, on site, of the state of the structure with the result of the previously calculated simulations.

The software means are moreover preferably arranged to correct uncertainties in the simulation results database by updating the predictive structural simulation using the visual inspection data.

The mobile visual references database advantageously comprises a number of degradation reference curves corresponding to a plurality of deterioration of the structure situations at predetermined moments.

The mobile visual references database can moreover comprise information relative to the physical model used to model the deterioration of the structure.

The equipment according to the invention can also comprise a database to contain the data retrieved by the user during his survey.

According to another aspect of the invention, a method to optimize a visual inspection and survey of a structure, in particular in civil engineering, is proposed, implemented in a portable equipment according to the invention, comprising:

a calculation of deterioration indicators and of key ageing parameters of said structure, by interpolation of data coming from a simulation results database, a representation of several possible visual aspects of a structural element of said structure at different moments of its life, using reference images coming from a visual references database, and a categorization of the state of said structure by comparing the actual aspect of said structure with said reference images.

This method can moreover comprise a correction of uncertainties in the simulation results database, by updating the predictive simulation of the properties of the structure using visual inspection data.

Moreover, the method according to the invention can advantageously comprise a calculation, using visual reference images, of the state of the structure surveyed at a given instant.

Updating the predictive simulation can advantageously comprise associating a probability with a reference image chosen by a user as being the closest to the actual observed state of a structure.

The present invention also comprises resorting to extrapolation laws to rapidly simulate the deterioration phenomena.

Another advantage of the present invention comprises offering the user a device for displaying the pathologies of the structure, in both the current state and in the future state.

The method according to the invention thus allows for the physical laws of deterioration of the materials to be taken into account to optimize the visual inspection and the connected decisions.

The solution proposed allows:

for the incertitude of observation to be reduced by providing a catalogue of reference images on a computer (for example a PDA), a catalogue usable on site, even if the site is difficult to access, for a better targeting of the visual inspections on the phenomena to be observed, for collection of the information allowing the deterioration kinetics initially integrated in the software to be updated, for the inspection function to be valorized by allowing a first interpretation, on site, of the phenomena observed and of their kinetics over time, for the development, on site, of the knowledge of characteristic features of the inspectors using a pedagogically powerful tool.

The method according to the invention depends on the extrapolation of values of degradation indicators using a database of modelling results and their visual representation using a database of images.

The modelling of the phenomena allows for the evolution in the time of the deterioration indicators to be obtained.

Having available images coming from the results of experience on actual structures, it is then possible to associate an image with a level of deterioration, and therefore with a time.

Figure 2:
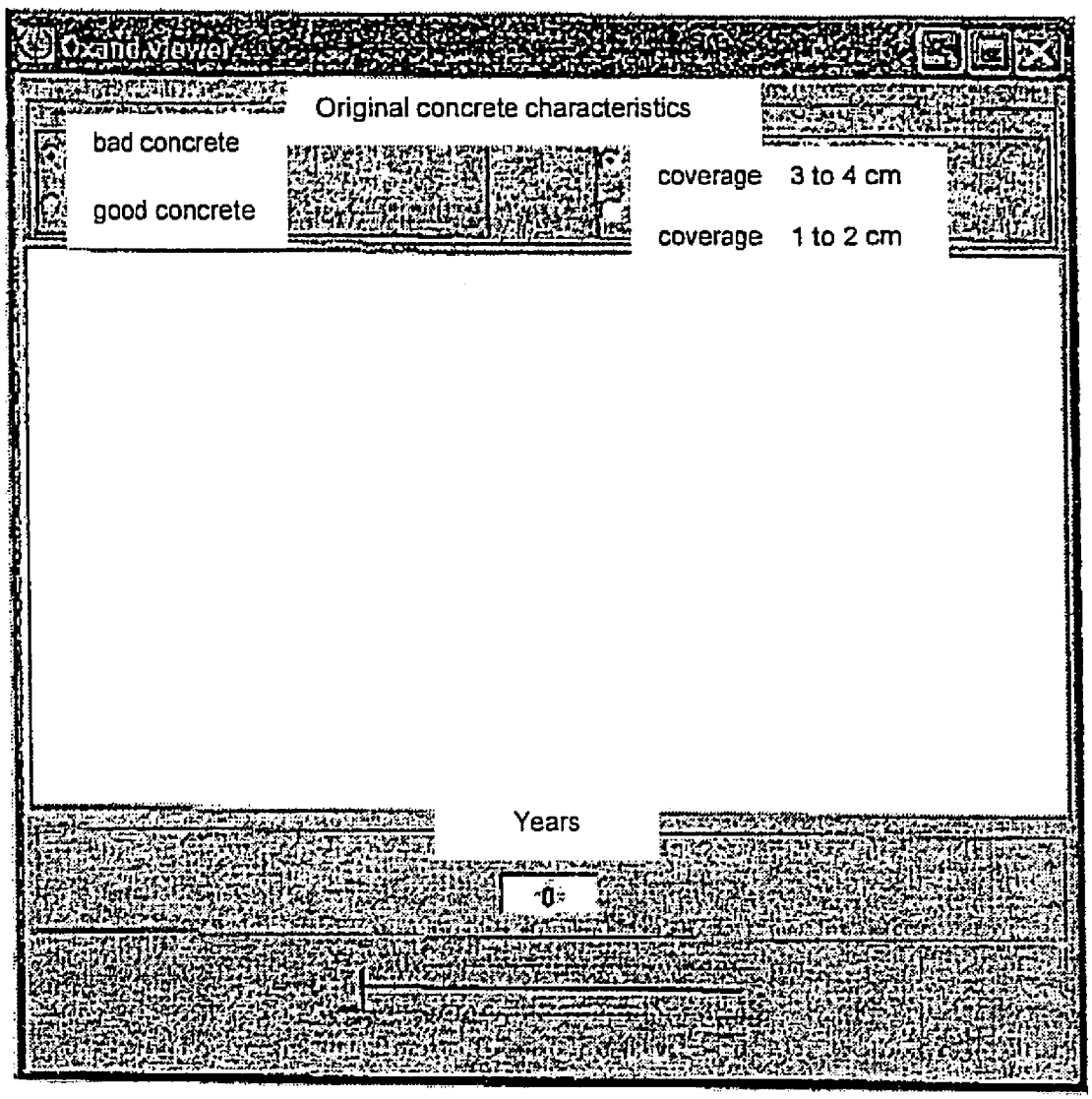
Figure 3:
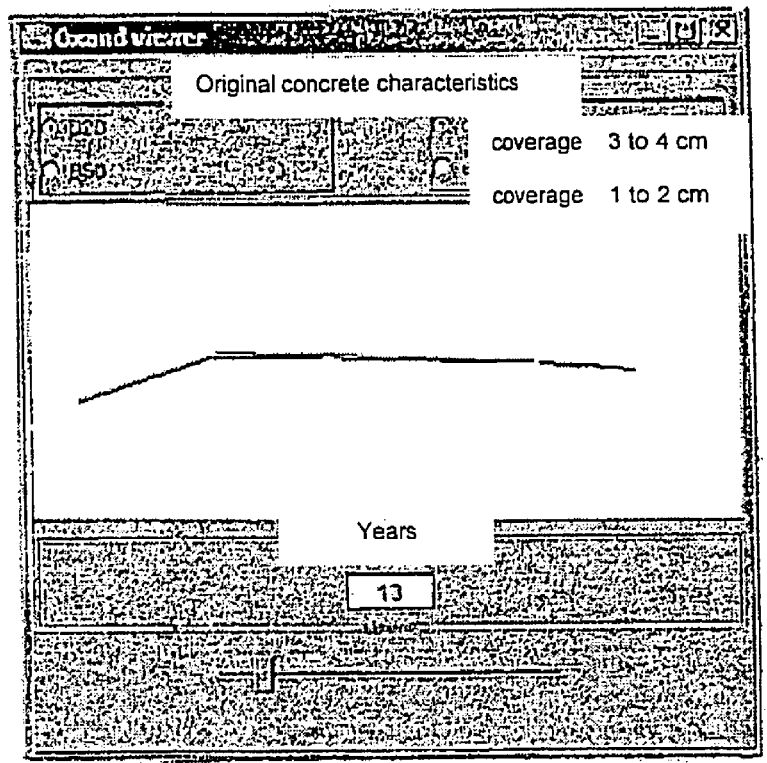
Figure 4:
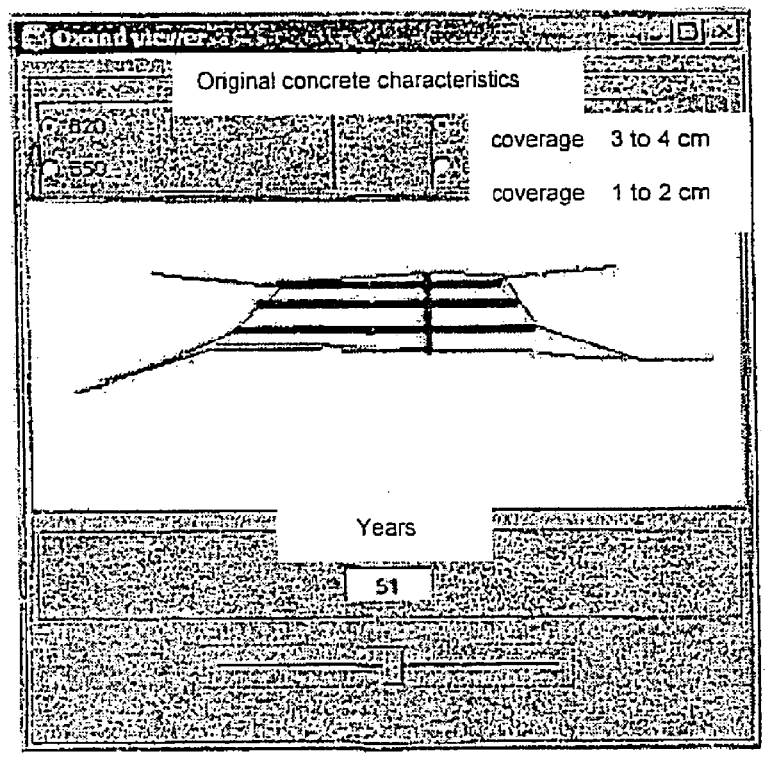
Figure 5:
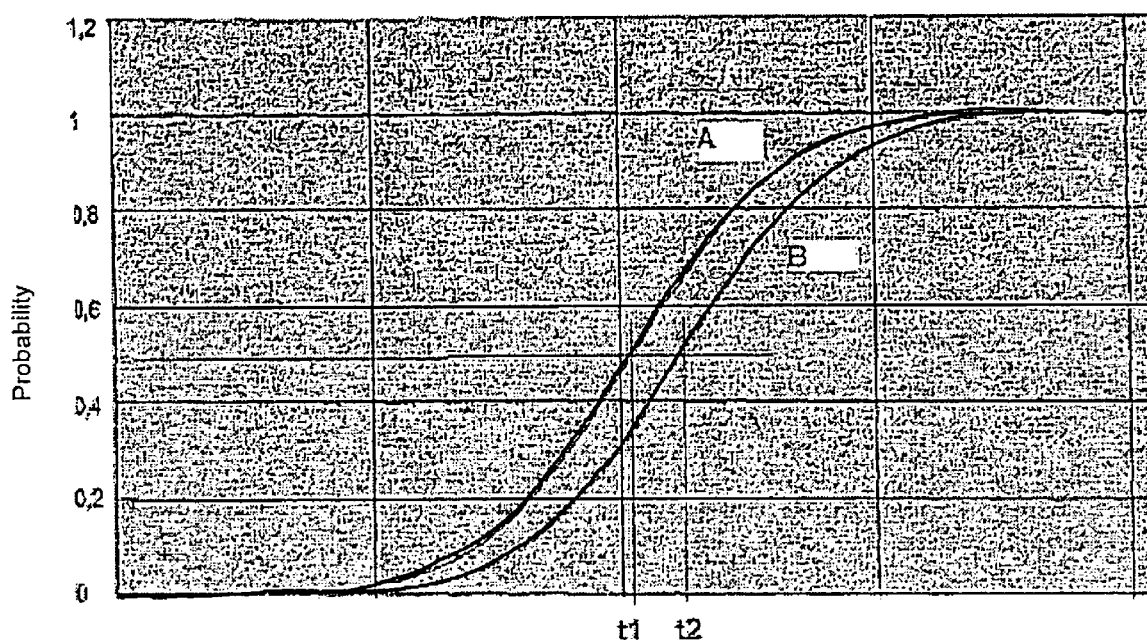
Figure 6:
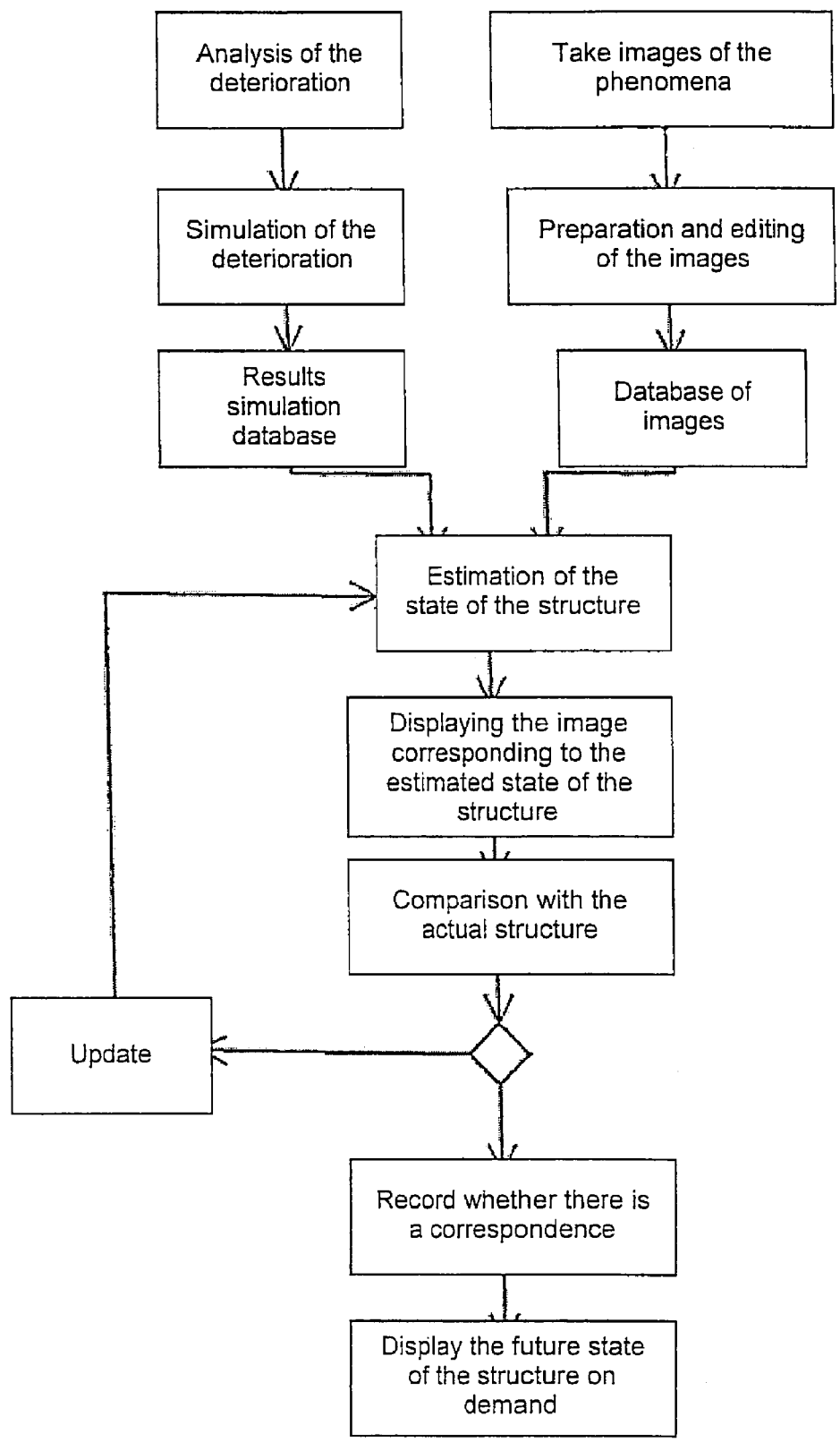

Other advantages and characteristics of the invention will appear on examining the detailed description of a non-limiting method of implementation, and of the attached drawings in which:

FIG. 1 illustrates an example of an evolution time curve of an indicator of deterioration contained in the visual references database;

FIGS. 2, 3 and 4 illustrate an application of a tool implementing the virtual reality method according to the invention, to carry out the monitoring of a corrosion process of the reinforcements of a concrete structure, respectively for the years 13, 31 and 51;

FIG. 5 illustrates a method of updating the result of simulations implemented in the method according to the invention; and FIG. 6 represents the main components of a virtual reality system implementing the virtual reality method according to the invention.

We will now describe an example of implementation of a virtual reality system implementing the virtual reality method according to the invention. With reference to FIG. 1, if the phenomenon studied is the corrosion of the reinforcements in reinforced concrete and the failure indicator is a palling of the concrete, the image associated with t0 is an image of concrete without traces of rust, t1 corresponds to an image with a few small traces of rust, t2 corresponds to an image with numerous traces of rust and fissures due to corrosion, t3 represents the image of split-block concrete and t4 shows concrete in which all of the reinforcement, very degraded, is apparent.

The mobile database comprises a set of these curves, corresponding to different situations.

To resume the previous example on the corrosion of the reinforcements, the corrosion depends on different parameters such as temperature, the coverage of the concrete, the relative humidity, the presence of chloride . . . The database thus contains a degradation reference curve for all sets (temperature, coverage, relative humidity, presence of chloride . . . ).

More precisely, this mobile database contains:
a summary description of the physical model which is the origin of the typical cases:
a description of the field of use of the model,
the origin of the model (empiric, calculated),
the author of the model,
the creation date of the model,
a list of the input parameters, summarizing for each parameter:
the name of the parameter,
the unit,
the greatest usable value, which corresponds to the greatest value used in the previously calculated simulations,
the smallest usable value;
The set of previously calculated results. For each set of the input parameters:
a series of images corresponding to different moments,
an indicator of state (for example chosen from: new, good, average, degraded, very degraded) associated with each image.

The inspection tool placed at the disposal of a user in the form of portable equipment according to the invention comprises:
a computer, for example a PC or a PDA,
a reference database of images of the type described previously,
software for using this database.
This software offers the following functions:
verified input of the possible input parameters,
input, if necessary, of the time parameter,
calculation, by interpolation from the typical cases coming from the reference database, of the state of the structure at the selected time,
displaying the associated image,
modification, if necessary, of the time parameter or of another input parameter to best identify the image corresponding to the actual structure,
retiming, if necessary, of the structure degradation kinetics.

Two applications can be envisaged. In a first application, the user enters or selects a certain number of input values. The system calculates the output value(s) by extrapolation from the closest typical cases, and displays an image corresponding to the state of the system. By modifying the number of years, it thus gains access to a chronology of the pathological events, as much in the past as in the future.

In a second application, the user observes his structure and searches for the image which best corresponds to the structure. It starts by entering an estimation of the parameters, then progressively modifies them until the image closest to the actual state of the system is found.

It is then possible to update the result of the simulations. By way of non-limiting example of a method of updating, the visual references database associates the chosen image with a given probability.

In the results simulation database, this probability corresponds, as curve A of FIG. 5 illustrates, to the time t1. But if this phenomenon actually occurs at time t2, the updating algorithm will then consider that the kinetics of the degradation is given by curve B of FIG. 5 and not by curve A. The structure degradation forecasts are then modified as a consequence.

The main components of an inspection tool implementing the method according to the invention are represented in FIG. 6. This inspection tool can be implemented in lava.

Below is an extract of the code from the visual references database:

```
String model ="Corrosion of reinforcements";
String author ="Kefei Li, PhD";
String origin="Calculated in ETU/2003/003/A";
int [ ] case0 = {0,15,25,30,40,45,50,60};
int [ ] case1 = new int[8];
int [ ] case2 = new int[8];
int [ ] case3 = new int[8];
for (int i = 0; i <stateNumber; i++) {
        case1[i] = case0[i]*2;
        case2[i] = case0[i]*4;
        case3[i] = case0[i] *30/50;
}
```

Hereafter is an extract of the image selection code:

```
private void updateImage (int value) {
    switch(currentState) {
        case 0:
            for (int i = 1; i < stateNumber; i++){
                if(__value < case0[i]) {
                    Image__Panel.setCurrentImage(i-1);
                    return;
                }Image__Panel.setCurrentImage(7);
            break;
        case 1:
            for (int i = 1; i< stateNumber ; i++){
                if(__value < case1[i]) {
                    Image__Panel.setCurrentImage(i-1);
                    return;
                }
            }Image__Panel.setCurrentImage(7);
            break;
        case 2:
            for (int i = 1; i< stateNumber ; i++){
                if(__value < case2[i]) {
                    Image__Panel.setCurrentImage(i-1);
                    return;
                }
            }Image__Panel.setCurrentImage(7);
            break;
        case 3:
            for (int i = 1; i < stateNumber ; i++){
                if(__value < case3 [i]) {
                    Image Panel.setCurrentImage(i-1);
                    return;
                }
```

```
                }Image_Panel.setCurrentImage(7);
                break;
        }
    }
```

The main applications of this tool are found in the field of civil engineering, mechanical engineering, air, maritime, rail and automobile transport, the chemical industry and agriculture.

In this last field, the system and the method according to the invention can be implemented to inspect the growth of plants.

The invention is of course not limited to the examples which have just been described and numerous adjustments can be made to these examples without going outside the framework of the invention.

The invention claimed is:

1. A portable computing equipment to optimize a visual inspection and survey of a structure, in particular in civil engineering, comprising:
    a mobile visual references database of pathologies at different stages of progress, and
    software means for:
        calculating, by interpolation of data coming from a predictive material and structural physical simulation results database, deterioration indicators and key ageing parameters,
        representing several possible visual aspects of a structural element of said structure at different moments in its life, using reference images coming from the visual references database, and
        categorizing the state of said structure by comparing the actual visual aspect of said structure with said reference images.

2. The equipment according to claim 1, wherein the mobile visual references database comprises a set of degradation reference curves corresponding to a plurality of deterioration situations of the structure at predetermined moments.

3. The equipment according to claim 1, wherein the mobile visual references database further comprises information relative to the physical model used to model the deterioration of the structure.

4. The equipment according to claim 1, wherein the software means are moreover designed to correct the uncertainties on the simulation results database.

5. A method to optimize a visual inspection and survey of a structure, in particular in civil engineering, implemented in a portable computing equipment according to claim 1, comprising:
    a calculation of the deterioration indicators and of key ageing parameters of said structure, by interpolation of data coming from a structural simulation results database,
    a representation of several possible visual aspects of a structural element of said structure at different moments of its life, using reference images coming from a visual references database, and
    a categorization of the state of said structure by comparing the actual visual aspect of said structure with said reference images.

6. A method according to claim 5, wherein it comprises further a correction of uncertainties in the simulation results database.

7. A method according to claim 5, wherein it further comprises a calculation, using visual reference images, of the state of the structure surveyed at a given instant.

8. An application the portable computing equipment and of the method according to claim 1, to carry out the monitoring of a reinforcement corrosion process of a concrete structure.

9. The equipment according to claim 2, wherein the mobile visual references database further comprises information relative to the physical model used to model the deterioration of the structure.

10. The method according to claim 6, wherein it further comprises a calculation, using visual reference images, of the state of the structure surveyed at a given instant.

11. The equipment according to claim 2, the deterioration situations of the structure at predetermined moments are the deterioration situation of a civil engineering structure.

* * * * *